US007054448B2

(12) United States Patent
Yoshino et al.

(10) Patent No.: US 7,054,448 B2
(45) Date of Patent: May 30, 2006

(54) AUTOMATIC SOUND FIELD CORRECTING DEVICE

(75) Inventors: Hajime Yoshino, Tokorozawa (JP); Kazuya Tsukada, Tokorozawa (JP)

(73) Assignee: Pioneer Corporation, Tokyo-to (JP)

( * ) Notice: Subject to any disclaimer, the term of this patent is extended or adjusted under 35 U.S.C. 154(b) by 488 days.

(21) Appl. No.: 10/127,414

(22) Filed: Apr. 23, 2002

(65) Prior Publication Data

US 2002/0159602 A1 Oct. 31, 2002

(30) Foreign Application Priority Data

Apr. 27, 2001 (JP) ............................ 2001-133572

(51) Int. Cl.
*H04R 29/00* (2006.01)
*H03G 3/00* (2006.01)
*H03G 5/00* (2006.01)

(52) U.S. Cl. ............................ 381/59; 381/58; 381/61; 381/103

(58) Field of Classification Search ............ 381/56–59, 381/103, 61, 98, 71.1
See application file for complete search history.

(56) References Cited

U.S. PATENT DOCUMENTS 5,771,297 A * 6/1998 Richardson .................. 381/57
5,815,580 A * 9/1998 Craven et al. ................ 381/58
5,953,431 A * 9/1999 Yashima et al. ............ 381/103

FOREIGN PATENT DOCUMENTS

JP 06-13292 2/1994

* cited by examiner

*Primary Examiner*—Laura A. Grier
(74) *Attorney, Agent, or Firm*—Young & Thompson

(57) ABSTRACT

An automatic sound field correcting device applies signal processing onto audio signals of plural channels and outputs processed audio signals to corresponding plural speakers. The automatic sound field correcting device includes: a noise measuring unit for measuring environmental noise level; a signal level determining unit for determining a measurement signal level based on the environmental noise level; and a correcting unit for outputting a measurement signal having the determined measurement signal level to perform automatic sound field correction.

11 Claims, 15 Drawing Sheets

AUTOMATIC SOUND FIELD CORRECTING DEVICE

BACKGROUND OF THE INVENTION

1. Field of the Invention

This invention relates to an automatic sound field correcting device for automatically correcting sound field characteristics in an audio system having a plurality of speakers.

2. Description of Related Art

For an audio system having a plurality of speakers to provide a high quality sound field space, it is required to automatically create an appropriate sound field space with much presence. In other words, it is required for the audio system to automatically correct sound field characteristics because it is quite difficult for a listener to appropriately adjust the phase characteristic, the frequency characteristic, the sound pressure level and the like of sound reproduced by a plurality of speakers by manually manipulating the audio system by himself to obtain appropriate sound field space.

An audio system of this kind is disclosed in a Japanese utility model application laid-open under No. 6-13292. This audio system includes equalizers for receiving audio signals of multiple channels and controlling the frequency characteristics of the audio signals, and a plurality of delay circuits for delaying the audio signals that the equalizers output for the respective channels, and the signals output by the respective delay circuits are supplied to the plurality of speakers. In addition, in order to correct the sound field characteristics, the audio system further includes a pink noise generator, an impulse generator, a selector circuit, a microphone for measuring the reproduced sound reproduced by the speakers, a frequency analyzer and a delay time calculator. The pink noise generated by the pink noise generator is supplied to the equalizers via the selector circuit, and the impulse signal generated by the impulse generator is directly supplied to the speakers via the selector circuit.

When the delay characteristic of the sound field space is to be corrected, the impulse generator directly supplies the impulse signal to the speakers. The microphone collects and measures the impulse sound reproduced by the respective speakers, and the delay time calculator analyzes the measured signal to obtain the propagation delay time of the impulse sound from the position of the speakers to the listening position. Namely, the impulse signals are directly supplied to the respective speakers with delay times, and the delay time calculator obtains the time differences between the time when the respective impulse signals are supplied to the respective speakers to the time when the respective impulse signals reproduced by the respective speakers reach the microphone. Thus, the propagation delay times of the respective impulse sound are measured. Then, by adjusting the delay times of the delay circuits for the respective channels based on the propagation delay times thus measured, the delay characteristics of the sound field space are corrected.

On the other hand, when the frequency characteristics of the sound field space are to be corrected, the pink noise generator supplies the pink noise to the equalizers. Then, the microphone receives and measures the pink noise sound reproduced by the speakers, and the frequency analyzer analyses the frequency characteristics of the respective measured signals. By controlling the frequency characteristics of the equalizers by the feedback control based on the result of the analysis, the frequency characteristics of the sound field space are corrected.

However, such a sound field correction largely depends on the environment of the acoustic space in which the audio system is installed. Namely, the specific correction amounts of the respective correction items largely changes dependently upon an external noise such as external ambient noise and/or air conditioner noise and the signal output level of the respective channels. Therefore, in order to achieve accurate sound field correction, the sound field correction must be carried out in consideration of acoustic factors in the acoustic space in which the audio system is installed.

SUMMARY OF THE INVENTION

It is an object of the present invention to provide an automatic sound field correcting device that performs appropriate sound field correction in consideration of acoustic condition and situation in the acoustic space in which the audio system is installed.

According to one aspect of the present invention, there is provided an automatic sound field correcting device for applying signal processing onto audio signals of plural channels and outputting processed audio signals to corresponding plural speakers, including: a noise measuring unit for measuring environmental noise level; a signal level determining unit for determining a measurement signal level based on the environmental noise level; and a correcting unit for outputting a measurement signal having the determined measurement signal level to perform automatic sound field correction.

In accordance with the automatic sound field correcting device, the environmental noise of the acoustic space is measured prior to the automatic sound field correction, and the measurement signal level is determined based on the environmental noise level. Then,by outputting the measurement signal having the determined measurement signal level, the automatic sound field correction is performed.

The signal level determining unit may include: a calculating unit for calculating a necessary signal level necessary to obtain predetermined necessary S/N level under the measured environmental noise level; a measuring unit for measuring a microphone input level at a time when a signal output from the speaker is input to a microphone; and a setting unit for setting the microphone input level to the measurement signal level when the microphone input level is larger than the necessary signal level. This can obtain the measurement signal level that can satisfy the necessary S/N ratio.

The signal level determining unit may include: a calculating unit for calculating a necessary signal level necessary to obtain predetermined necessary S/N level under the measured environmental noise level; a measuring unit for measuring a microphone input level at a time when a signal output from the speaker is input to a microphone; and an increasing unit for increasing the measurement signal level up to the necessary signal level, within a range smaller than a predetermined permissible level, when the microphone input level is smaller than the necessary signal level. This can obtain the measurement signal level that can offer the S/N ratio as close as possible to the necessary S/N ratio in a range smaller than a predetermined permissible level.

The noise measurement unit may determine the environmental noise level based on an output signal of a microphone when no signal is being output. Thus, the existence of the speaker connection can be automatically judged.

The device may further include: a first threshold value determining unit for determining the first threshold value based on the environmental noise level and the measurement signal level; a speaker existence judgment unit for judging a connection of a speaker to the channel based on the first threshold. By comparing the detected level with the first threshold value, the presence and absence of the speaker can be judged.

The speaker existence judgment unit may include: an output unit for outputting a measurement signal having the measurement signal level; a determining unit for collecting the measurement signal output and determining a detection level of the collected measurement signal; and a judging unit for determining a presence of a speaker when the detection level is larger than the first threshold value and determining an absence of a speaker when the detection level is smaller than the first threshold value.

In a preferred embodiment, the first threshold determining unit may determine the first threshold value to a middle level of the environmental noise level and the measurement signal level.

The device may further include: a second threshold value determining unit for determining a second threshold value based on the environmental noise level and the measurement signal level; an output unit for outputting a pulse signal; and a measuring unit for measuring a delay characteristic by detecting the pulse signal received by a microphone by using the second threshold value. By comparing the signal receiving level of the pulse signal with the second threshold value, the delay characteristic may be corrected.

According to another aspect of the present invention, there is provided a program storage device readable by a computer, tangibly embodying a program of instructions executable by the computer to control the computer to function as an automatic sound field correcting device for applying signal processing onto audio signals of plural channels and outputting processed audio signals to corresponding plural speakers, including: a noise measuring unit for measuring environmental noise level; a signal level determining unit for determining a measurement signal level based on the environmental noise level; and a correcting unit for outputting a measurement signal having the determined measurement signal level to perform automatic sound field correction.

According to still another aspect of the present invention, there is provided a computer data signal embodied in a carrier wave and representing a series of instructions which cause a computer to function as an automatic sound field correcting device for applying signal processing onto audio signals of plural channels and outputting processed audio signals to corresponding plural speakers, including: a noise measuring unit for measuring environmental noise level; signal level determining unit for determining a measurement signal level based on the environmental noise level; and a correcting unit for outputting a measurement signal having the determined measurement signal level to perform automatic sound field correction.

By executing the computer program or computer data signal, the above-mentioned automatic sound field correction can be achieved.

The nature, utility, and further features of this invention will be more clearly apparent from the following detailed description with respect to preferred embodiment of the invention when read in conjunction with the accompanying drawings briefly described below.

DETAILED DESCRIPTION OF THE PREFERRED EMBODIMENTS

[1] System Configuration

Figure 1:
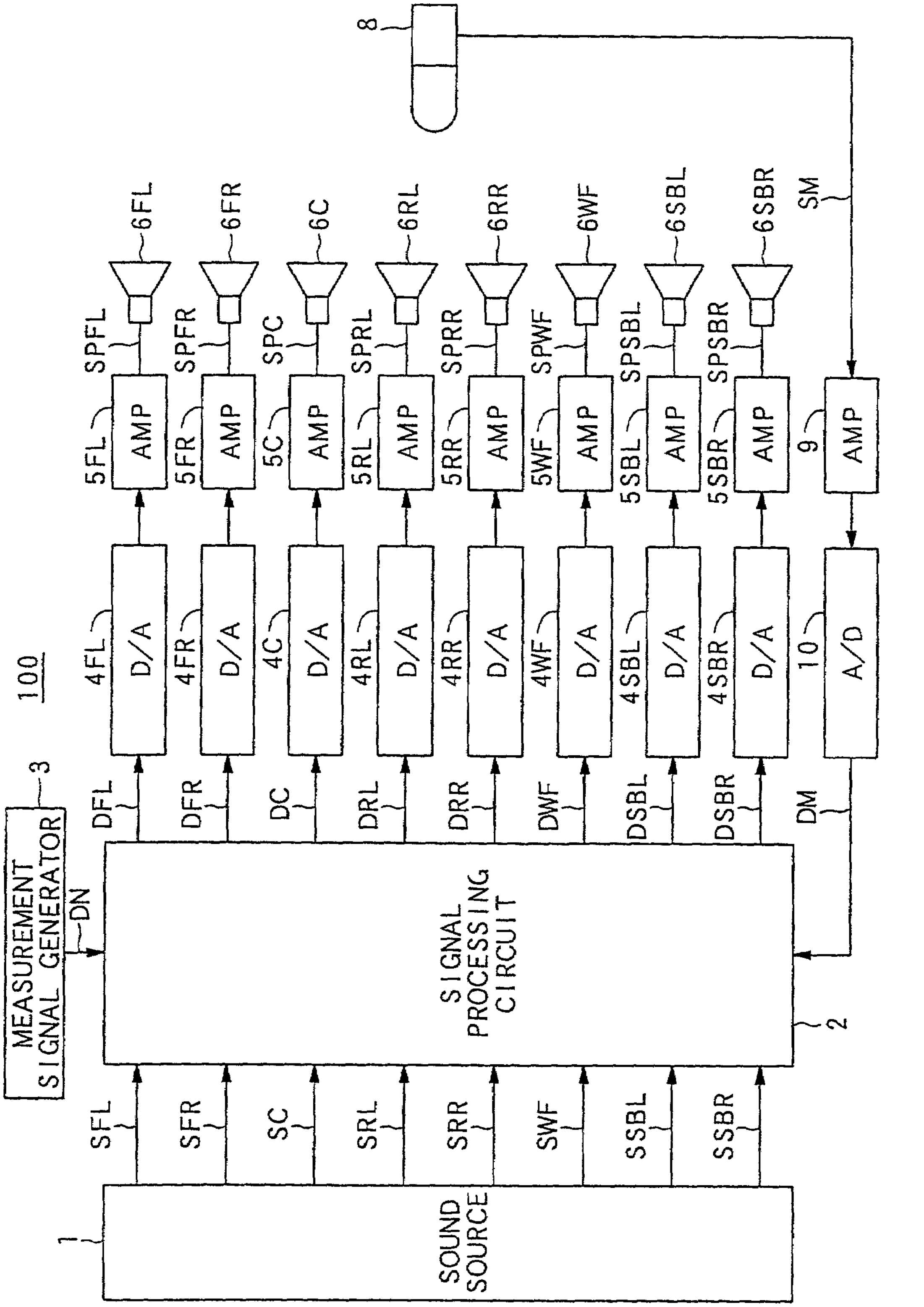
FIG. 1 is a block diagram showing a configuration of an audio system employing an automatic sound field correcting device according to an embodiment of the present invention.

A preferred embodiment of an automatic sound field correcting system according to the present invention will now be described below with reference to the attached drawings. FIG. 1 is a block diagram showing an audio system employing the automatic sound field correcting system according the embodiment of the invention.

In FIG. 1, the audio system 100 includes a sound source 1 such as a CD (Compact Disc) player or a DVD (Digital Video Disc or Digital Versatile Disc) player, a signal processing circuit 2 to which the sound source 1 supplies digital audio signals SFL, SFR, SC, SRL, SRR, SWF, SSBL and SSBR via the multi-channel signal transmission path, and a measurement signal generator 3.

While the audio system 100 includes the multi-channel signal transmission paths, the respective channels are referred to as "FL-channel", "FR-channel" and the like in the following description. In addition, the subscripts of the reference number are omitted to refer to all of the multiple channels when the signals or components are expressed. On the other hand, the subscript is put to the reference number when a particular channel or component is referred to. For example, the description "digital audio signals S" means the digital audio signals SFL to SSBR, and the description "digital audio signal SFL" means the digital audio signal of only the FL-channel.

Further, the audio system 100 includes D/A converters 4FL to 4SBR for converting the digital output signals DFL to DSBR of the respective channels processed by the signal processing by the signal processing circuit 2 into analog signals, and amplifiers 5FL to 5SBR for amplifying the respective analog audio signals output by the D/A converters 4FL to 4SBR. In this system, the analog audio signals SPFL to SPSBR after the amplification by the amplifiers 5FL to 5SBR are supplied to the multi-channel speakers 6FL to 6SBR positioned in a listening room 7, shown in FIG. 6 as an example, to output sounds.

The audio system 100 also includes a microphone 8 for collecting reproduced sounds at the listening position RV, an amplifier 9 for amplifying a collected sound signal SM output from the microphone 8, and an A/D converter 10 for converting the output of the amplifier 9 into a digital collected sound data DM to supply it to the signal processing circuit 2.

The audio system 100 activates full-band type speakers 6FL, 6FR, 6C, 6RL, 6RR having frequency characteristics capable of reproducing sound for substantially all audible frequency bands, a speaker 6WF having a frequency characteristic capable of reproducing only low-frequency sounds and surround speakers 6SBL and 6SBR positioned behind the listener, thereby creating sound field with presence around the listener at the listening position RV.

Figure 6:
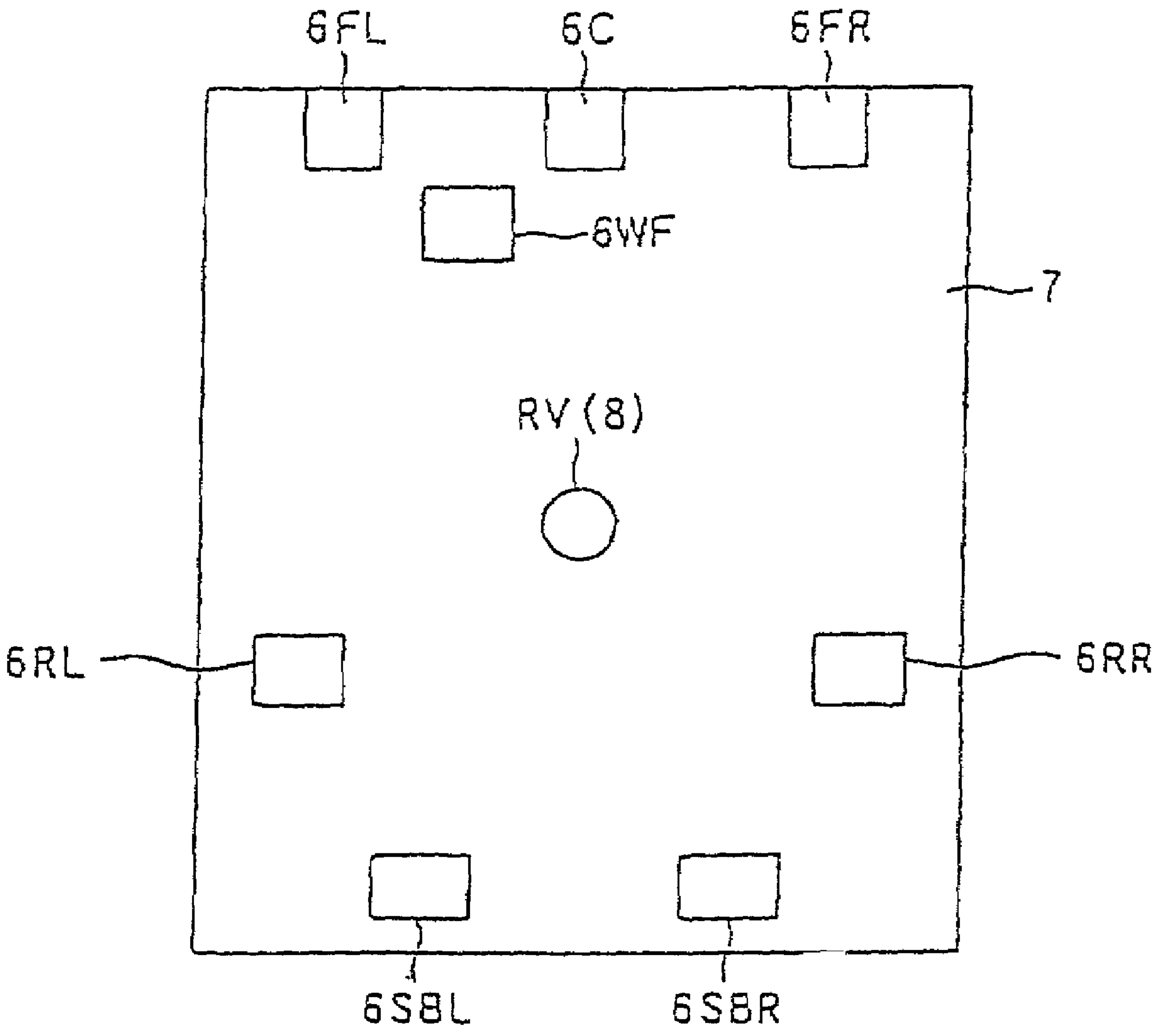
FIG. 6 is a diagram showing an example of speaker arrangement in a certain sound field environment.

With respect to the position of the speakers, as shown in FIG. 6, for example, the listener places the two-channel, left and right speakers (a front-left speaker and a front-right speaker) 6FL, 6FR and a center speaker 6C, in front of the listening position RV, according to the listener's taste. Also the listener places the two-channel, left and right speakers (a rear-left speaker and a rear-right speaker) 6RL, 6RR as well as two-channel, left and right surround speakers 6SBL, 6SBR behind the listening position RV, and further places the sub-woofer 6WF exclusively used for the reproduction of low-frequency sound at any position. The automatic sound field correcting system installed in the audio system 100 supplies the analog audio signals SPFL to SPSBR, for which the frequency characteristic, the signal level and the signal propagation delay characteristic for each channel are corrected, to those 8 speakers 6FL to 6SBR to output sounds, thereby creating sound field space with presence.

Figure 2:
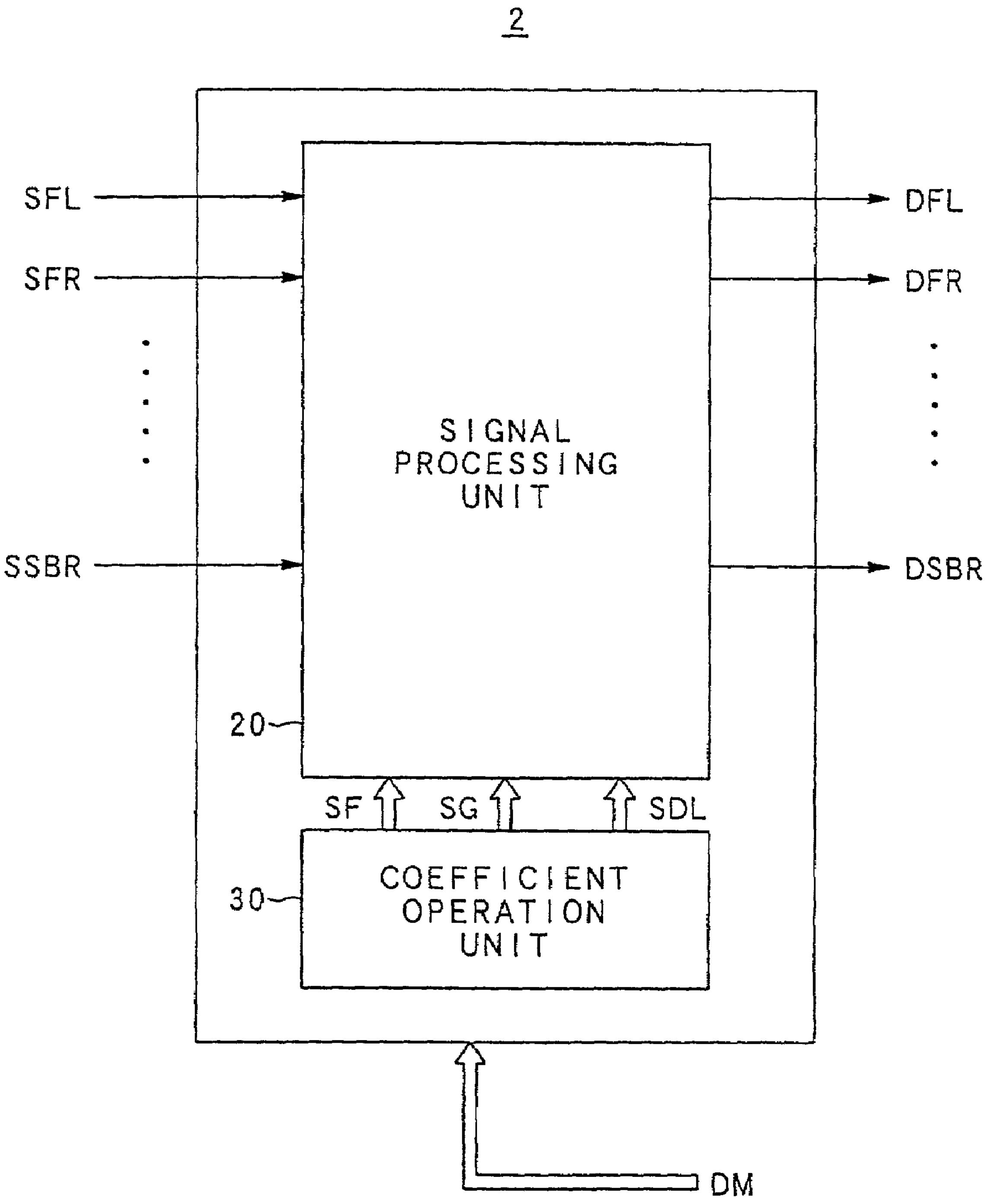
FIG. 2 is a block diagram showing an internal configuration of a signal processing circuit shown in FIG. 1.

The signal processing circuit 2 may have a digital signal processor (DSP), and roughly includes a signal processing unit 20 and a coefficient operating unit 30 as shown in FIG. 2. The signal processing unit 20 receives the multi-channel digital audio signals from the sound source 1 reproducing sound from various sound sources such as CD, DVD or else, and performs the frequency characteristic correction, the level correction and the delay characteristic correction for each channel to output the digital output signals DFL to DSBR. The coefficient operation unit 30 receives the signal collected by the microphone 8 as the a digital collected sound data DM, generates the coefficient signals SF1 to SF8, SG1 to SG8, SDL1 to SDL8 for the frequency characteristic correction, the level correction and the delay characteristic correction, and supplies them to the signal processing unit 20. The signal processing unit 20 appropriately performs the frequency characteristic correction, the level correction and the delay characteristic correction based on the collected sound data DM from the microphone 8, and the speakers 6 output optimum sounds.

In addition, the signal processing circuit 2 performs a speaker existence judgment process for automatically detecting whether or not a speaker is connected to each channel, and a speaker kind judgment process for judging the kind of the speakers (e.g., a small speaker having low reproduction capability of low frequency range, a large speaker having reproduction capability of low to middle frequency range, and the like).

Figure 3:
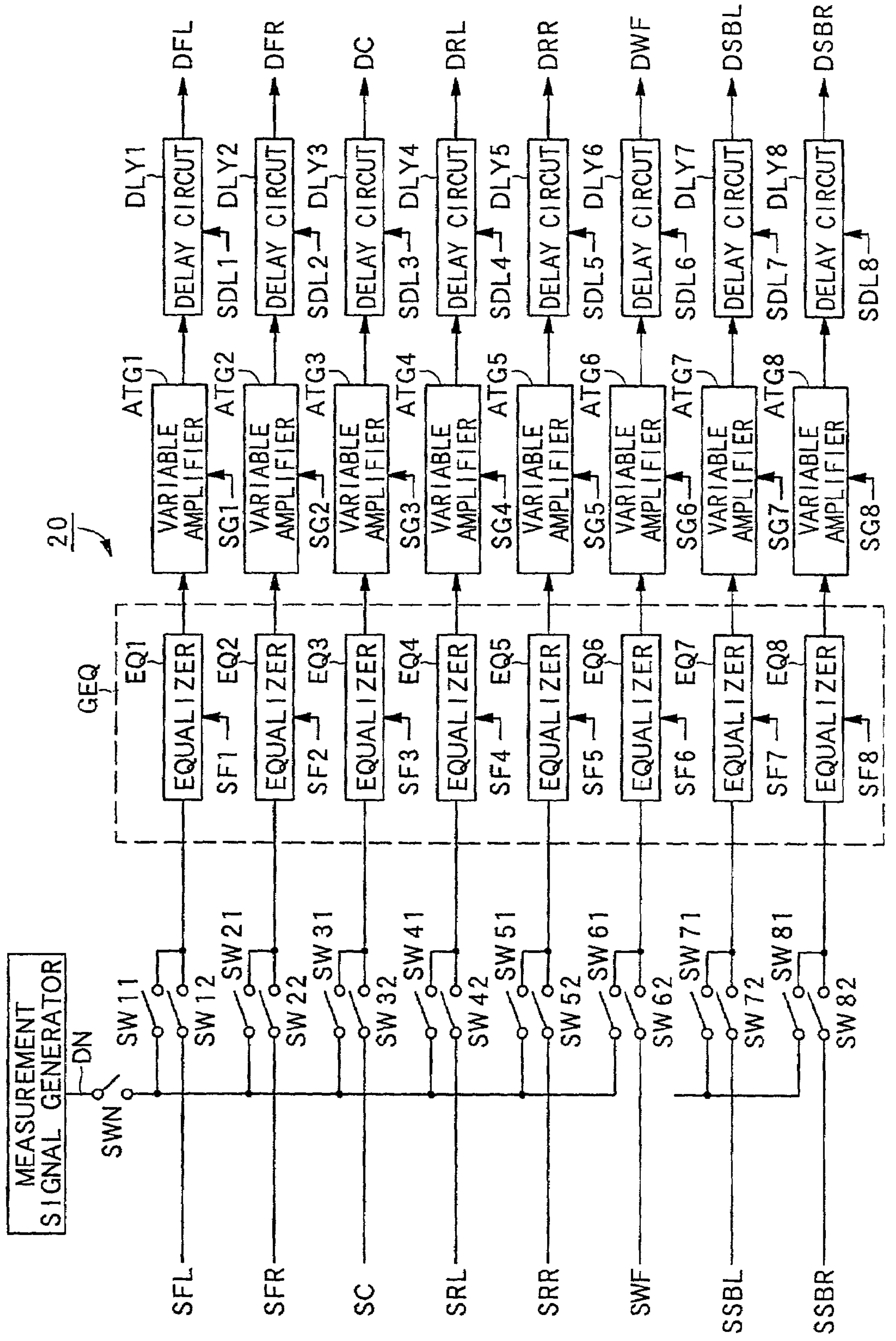
FIG. 3 is a block diagram showing a configuration of a signal processing unit shown in FIG. 2.
Figure 4:
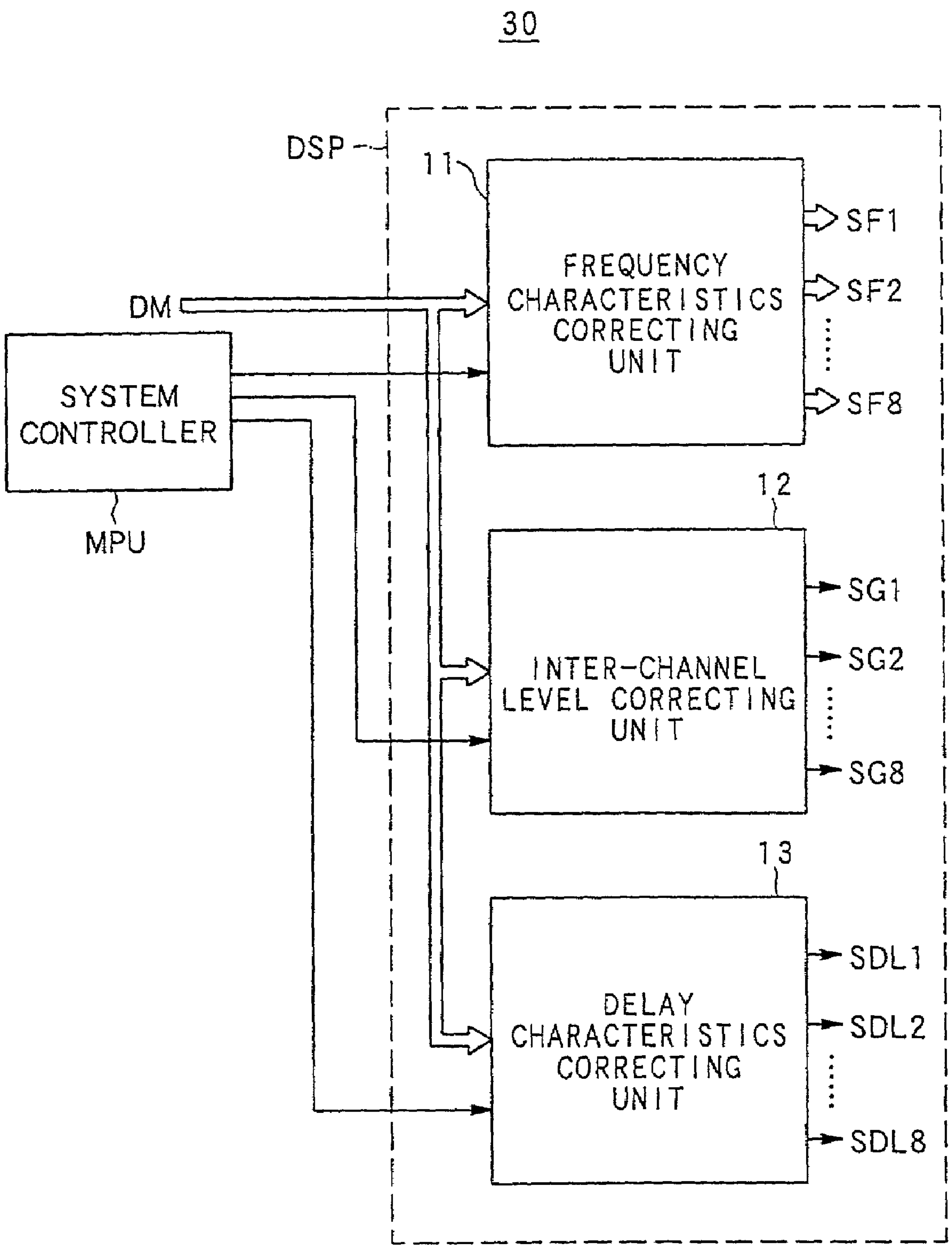
FIG. 4 is a block diagram showing a configuration of a coefficient operation unit shown in FIG. 2.

As shown in FIG. 3, the signal processing unit 20 includes a graphic equalizer GEQ, variable amplifiers ATG1 to ATG8, and delay circuits DLY1 to DLY8. On the other hand, the coefficient operation unit 30 includes, as shown in FIG. 4, a system controller MPU, a frequency characteristics correcting unit 11, an inter-channel level correcting unit 12 and a delay characteristics correcting unit 13. The frequency characteristics correcting unit 11, the inter-channel level correcting unit 12 and the delay characteristics correcting unit 13 constitute DSP.

The frequency characteristics correcting unit 11 controls the frequency characteristics of the equalizers EQ1 to EQ8 corresponding to the respective channels of the graphic equalizer GEQ. The inter-channel level correcting unit 12 controls the attenuation factors of the variable amplifiers ATG1 to ATG8, and the delay characteristics correcting unit 13 controls the delay times of the delay circuits DLY1 to DLY8. Thus, the sound field is appropriately corrected. In addition, the system controller MPU outputs predetermined measurement signals from the speakers 6FL to 6SBR of the respective channels, collects the output sound by using the microphone 8 to perform level detection and frequency analysis, thereby performing speaker existence judgment and the speaker kind judgment.

The equalizers EQ1 to EQ5, EQ7 and EQ8 of the respective channels are configured to perform the frequency characteristics correction for multiple frequency bands. Namely, the audio frequency band is divided into 9 frequency bands (each of the center frequencies are f1 to f9), for example, and the coefficients of the equalizer EQ is determined for each frequency bands to correct frequency characteristics. It is noted that the equalizer EQ6 is configured to control the frequency characteristic of low-frequency band.

The audio system 100 has two operation modes, i.e., an automatic sound field correcting mode and a sound source signal reproducing mode. The automatic sound field correcting mode is an adjustment mode, performed prior to the signal reproduction from the sound source 1, wherein the automatic sound field correction is performed for the environment that the audio system 100 is placed. Thereafter, the sound signal from the sound source 1 such as a CD player is reproduced in the sound source signal reproduction mode. The present invention mainly relates to the correction operation in the automatic sound field correcting mode.

With reference to FIG. 3, the switch element SW12 for switching ON and OFF the input digital audio signal SFL from the sound source 1 and the switch element SW11 for switching the input measurement signal DN from the measurement signal generator 3 are connected to the equalizer EQ1 of the FL-channel, and the switch element SW11 is connected to the measurement signal generator 3 via the switch element SWN. The switch elements SW11, SW12 and SWN are controlled by the system controller MPU configured by microprocessor and shown in FIG. 4.

When the sound source signal is reproduced, the switch element SW12 is turned ON, and the switch elements SW11 and SWN are turned OFF. On the other hand, when the sound field is corrected, the switch element SW12 is turned OFF and the switch elements SW11 and SWN are turned ON.

The variable amplifier ATG1 is connected to the output terminal of the equalizer EQ1, and the delay circuit DLY1 is connected to the output terminal of the variable amplifier ATG1. The output DFL of the delay circuit DLY1 is supplied to the D/A converter 4FL shown in FIG. 1.

The other channels are configured in the same manner, and switch elements SW21 to SW81 corresponding to the switch element SW11 and the switch elements SW22 to SW82 corresponding to the switch element SW12 are provided. In addition, the equalizers EQ2 to EQ8, the variable amplifiers ATG2 to ATG8 and the delay circuits DLY2 to DLY8 are provided, and the outputs DFR to DSBR from the delay circuits DLY2 to DLY8 are supplied to the D/A converters 4FR to 4SBR, respectively, shown in FIG.

Further, the variable amplifiers ATG1 to ATG8 vary the amplification factors in accordance with the adjustment signals SG1 to SG8 supplied from the inter-channel level correcting unit 12. By varying the amplification factors of the variable amplifiers ATG1 to ATG8, the output signal levels of the respective channels are determined. The delay circuits DLY1 to DLY8 controls the delay times of the input signal in accordance with the adjustment signals SDL1 to SDL8 from the phase characteristics correcting unit 13.

Figure 5A:
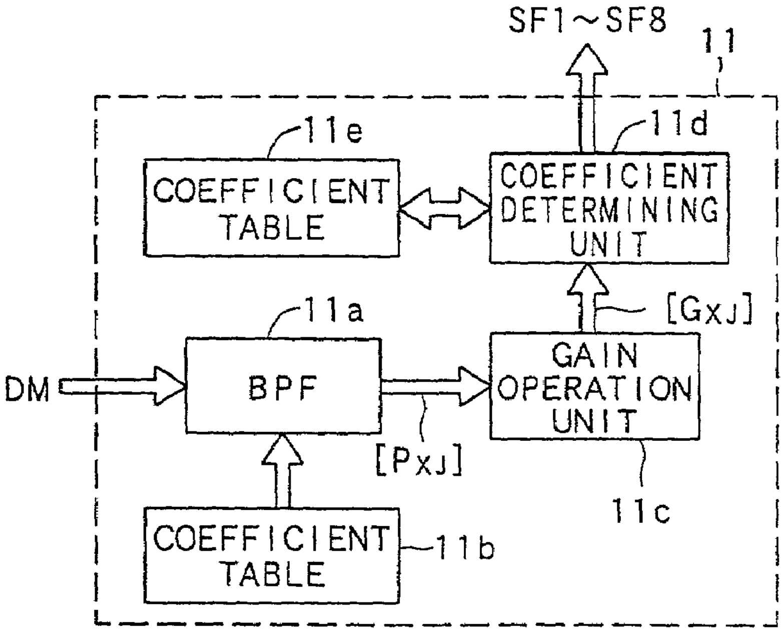
FIGS. 5A to 5C are block diagrams showing configurations of a frequency characteristics correcting unit, an inter-channel level correcting unit and a delay characteristics correcting unit shown in FIG. 4.

The frequency characteristics correcting unit 11 has a function to adjust the frequency characteristic of each channel to have a desired characteristic. As shown in FIG. 5A, the frequency characteristics correcting unit 11 includes a band-pass filter 11*a*, a coefficient table 11*b*, a gain operation unit 11*c*, a coefficient determining unit 11*d* and a coefficient table 11*e*.

The band-pass filter 11*a* is configured by a plurality of narrow-band digital filters passing 9 frequency bands set to the equalizers EQ1 to EQ8. The band-pass filter 11*a* discriminates 9 frequency bands each including center frequency f1 to f9 from the collected sound data DM from the A/D converter 10, and supplies the data [P×J] indicating the level of each frequency band to the gain operation unit 11*c*. The frequency discriminating characteristic of the band-pass filter 11*a* is determined based on the filter coefficient data stored, in advance, in the coefficient table 11*b*.

The gain operation unit 11*c* operates the gains of the equalizers EQ1 to EQ8 for the respective frequency bands at the time of the automatic sound field correction, and supplies the gain data [G×J] thus operated to the coefficient determining unit 11*d*. Namely, the gain operation unit 11*c* applies the data [P×J] to the transfer functions of the equalizers EQ1 to EQ8 known in advance to calculate the gains of the equalizers EQ1 to EQ8 for the respective frequency bands in the reverse manner.

The coefficient determining unit 11*d* generates the filter coefficient adjustment signals SF1 to SF8, used to adjust the frequency characteristics of the equalizers EQ1 to EQ8, under the control of the system controller MPU shown in FIG. 4. It is noted that the coefficient determining unit 11*d* is configured to generate the filter coefficient adjustment signals SF1 to SF8 in accordance with the conditions instructed by the listener. In a case where the listener does not instruct the sound field correction condition and the normal sound field correction condition preset in the sound field correction system is used, the coefficient determining unit 11*d* reads out the filter coefficient data, used to adjust the frequency characteristics of the equalizers EQ1 to EQ8, from the coefficient table lie by using the gain data [G×J] for the respective frequency bands supplied from the gain operation unit 11*c*, and adjusts the frequency characteristics of the equalizers EQ1 to EQ8 based on the filter coefficient adjustment signals SF1 to SF8 of the filter coefficient data.

In other words, the coefficient table 11*e* stores the filter coefficient data for adjusting the frequency characteristics of the equalizers EQ1 to EQ8, in advance, in a form of a look-up table. The coefficient determining unit 11*d* reads out the filter coefficient data corresponding to the gain data [G×J], and supplies the filter coefficient data thus read out to the respective equalizers EQ1 to EQ8 as the filter coefficient adjustment signals SF1 to SF8. Thus, the frequency characteristics are controlled for the respective channels.

The inter-channel level correcting unit 12 has a role to adjust the sound pressure levels of the sound signals of the respective channels to be equal. Specifically, the inter-channel level correcting unit 12 receives the collected sound data DM obtained when the respective speakers 6FL to 6SBR are activated by the measurement signal (pink noise) DN output from the measurement signal generator 3, and measures the levels of the reproduced sounds from the respective speakers at the listening position RV based on the collected sound data DM.

Figure 5B:
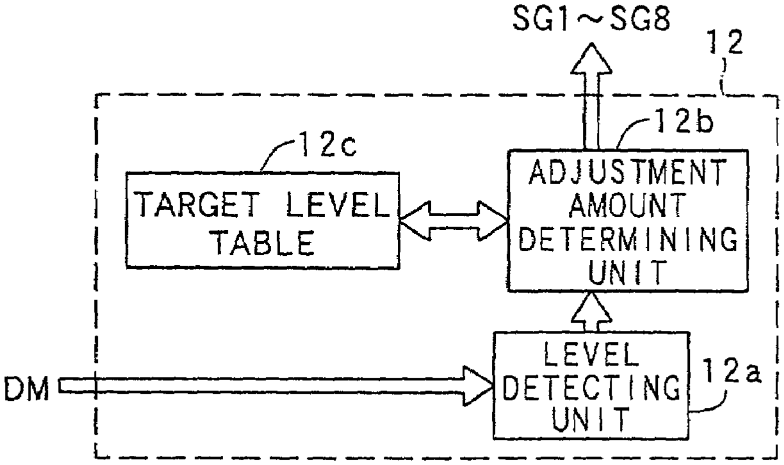

FIG. 5B shows the configuration of the inter-channel level correcting unit 12. The collected sound data DM output by the A/D converter 10 is supplied to the level detecting unit 12*a*. It is noted that the inter-channel level correcting unit 12 uniformly attenuates the signal levels of the respective channels for all frequency bands, and the frequency band division is not necessary. Therefore, the inter-channel level correcting unit 12 does not include any band-pass filter shown in the frequency characteristics correcting unit 11.

The level detecting unit 12*a* detects the level of the collected sound data DM, and carries out gain control so that the output audio signal level for all channels become equal to each other. Specifically, the level detecting unit 12*a* generates the level adjustment amount indicating the difference between the level of the collected sound data thus detected and a reference level, and supplies it to the adjustment amount determining unit 12*b*. The adjustment amount determining unit 12*b* generates the gain adjustment signals SG1 to SG8 corresponding to the level adjustment amount received from the level detecting unit 12*a*, and supplies the gain adjustment signals SG1 to SG8 to the respective variable amplifiers ATG1 to ATG8. The variable amplifiers ATG1 to ATG8 adjust the attenuation factors of the audio signals of the respective channels in accordance with the gain adjustment signals SG1 to SG8. By adjusting the attenuation factors of the inter-channel level correcting unit 12, the level adjustment (gain adjustment) for the respective channels is performed so that the output audio signal level of the respective channels become equal to each other. It is noted that the levels determined here are used as the signal levels of the respective channels.

The delay characteristics correcting unit 13 adjusts the signal delay resulting from the difference in distance between the positions of the respective speakers and the listening position RV. Namely, the delay characteristics correcting unit 13 has a role to prevent that the output signals from the speakers 6 to be listened simultaneously by the listener reach the listening position RV at different times. Therefore, the delay characteristics correcting unit 13 measures the delay characteristics of the respective channels based on the collected sound data DM which is obtained when the speakers 6 are individually activated by the measurement signal (a pulse signal in this case) output from the measurement signal generator 3, and corrects the phase characteristics of the sound field space based on the measurement result.

Specifically, by turning over the switches SW11 to SW81 shown in FIG. 3 one after another, the measurement signal DN generated by the measurement signal generator 3 is output from the speakers 6 for each channel, and the output sound is collected by the microphone 8 to generate the corresponding collected sound data DM. Assuming that the measurement signal is a pulse signal such as an impulse, the difference between the time when the speaker 6 outputs the pulse measurement signal and the time when the microphone 8 receives the corresponding pulse signal is proportional to the distance between the speaker 6 of each channel and the listening position RV. Therefore, the difference in distance of the speakers 6 of the respective channels and the listening position RV maybe absorbed by setting the delay time of all channels to the delay time of the channels having maximum delay time. Thus, the delay time between the signals generated by the speakers 6 of the respective channels become equal to each other, and the sound output from the multiple speakers 6 and coincident with each other on the time axis simultaneously reach the listening position RV.

Figure 5C:
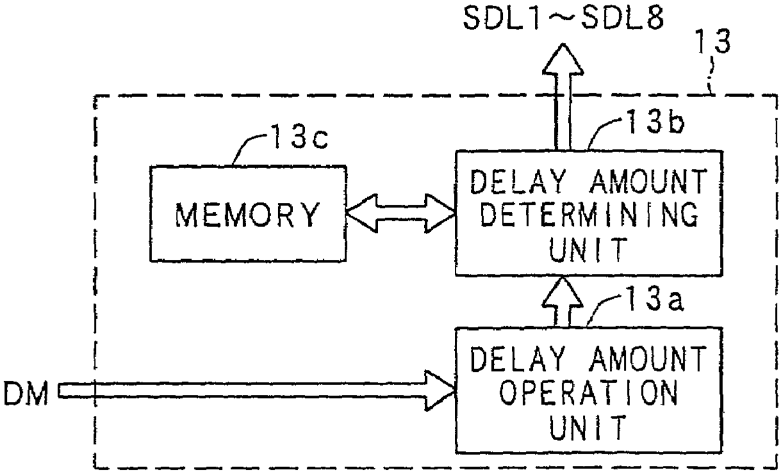

FIG. 5C shows the configuration of the delay characteristics correcting unit 13. The delay amount operation unit 13*a* receives the collected sound data DM, and operates the signal delay amount resulting from the sound field environment for the respective channels on the basis of the pulse delay amount between the pulse measurement signal and the collected sound data DM. The detection of the pulse delay amounts is performed by comparing the signal included in the collected sound data with a predetermined threshold (hereinafter referred to as "2nd threshold THd"). The delay amount determining unit 13*b* receives the signal delay amounts for the respective channels from the delay amount operating unit 13*a*, and temporarily stores them in the memory 13*c*. When the signal delay amounts for all channels are operated and temporarily stored in the memory 13*c*, the delay amount determining unit 13*b* determines the adjustment amounts of the respective channels such that the reproduced signal of the channel having the largest signal delay amount reaches the listening position RV simultaneously with the reproduced sounds of other channels, and supplies the adjustment signals SDL1 to SDL8 to the delay circuits DLY1 to DLY8 of the respective channels. The delay circuits DLY1 to DLY8 adjust the delay amount in accordance with the adjustment signals SDL1 to SDL8, respectively. Thus, the delay characteristics for the respective channels are carried out. It is noted that, while the above example assumed that the measurement signal is pulse signal, this invention is not limited to this, and other measurement signal may be used.

[2] Automatic Sound Field Correcting Process

Next, the description will be given of the operation of the automatic sound field correction by the automatic sound field correcting system employing the configuration described above.

As the environment in which the audio system 100 is used, the listener positions the multiple speakers 6FL to 6SBR in the listening room 7 as shown in FIG. 6, and connects the speakers 6FL to 6SBR to the audio system 100 as shown in FIG. 1. When the listener manipulates the remote controller (not shown) of the audio system 100 to instruct the start of the automatic sound field correction, the system controller MPU executes the automatic sound field correcting process in response to the instruction.

Next, the basic principle of the automatic sound field correction according to the present invention will be described. In the present invention, the measurement signal output level is controlled, for each channel, based on the environment of the acoustic space, specifically S/N ratio. In addition, based on S/N ratio, the first threshold THsp used in the speaker existence judgment process and the second threshold THd used in the delay characteristics correction process are determined.

Figure 7:
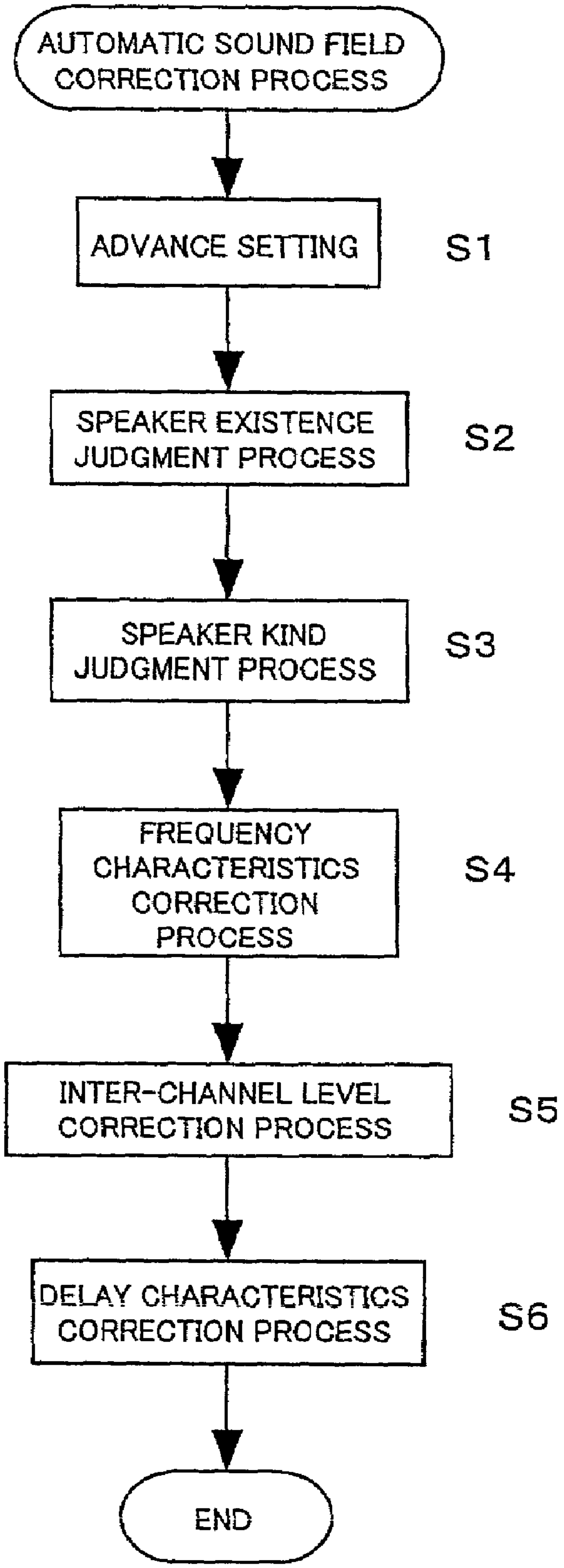
FIG. 7 is a flowchart showing a main routine of an automatic sound field correcting process.

Next, the outline of the automatic sound field correction process including the various processes will be described with reference to the flowchart shown in FIG. 7.

Figure 8:
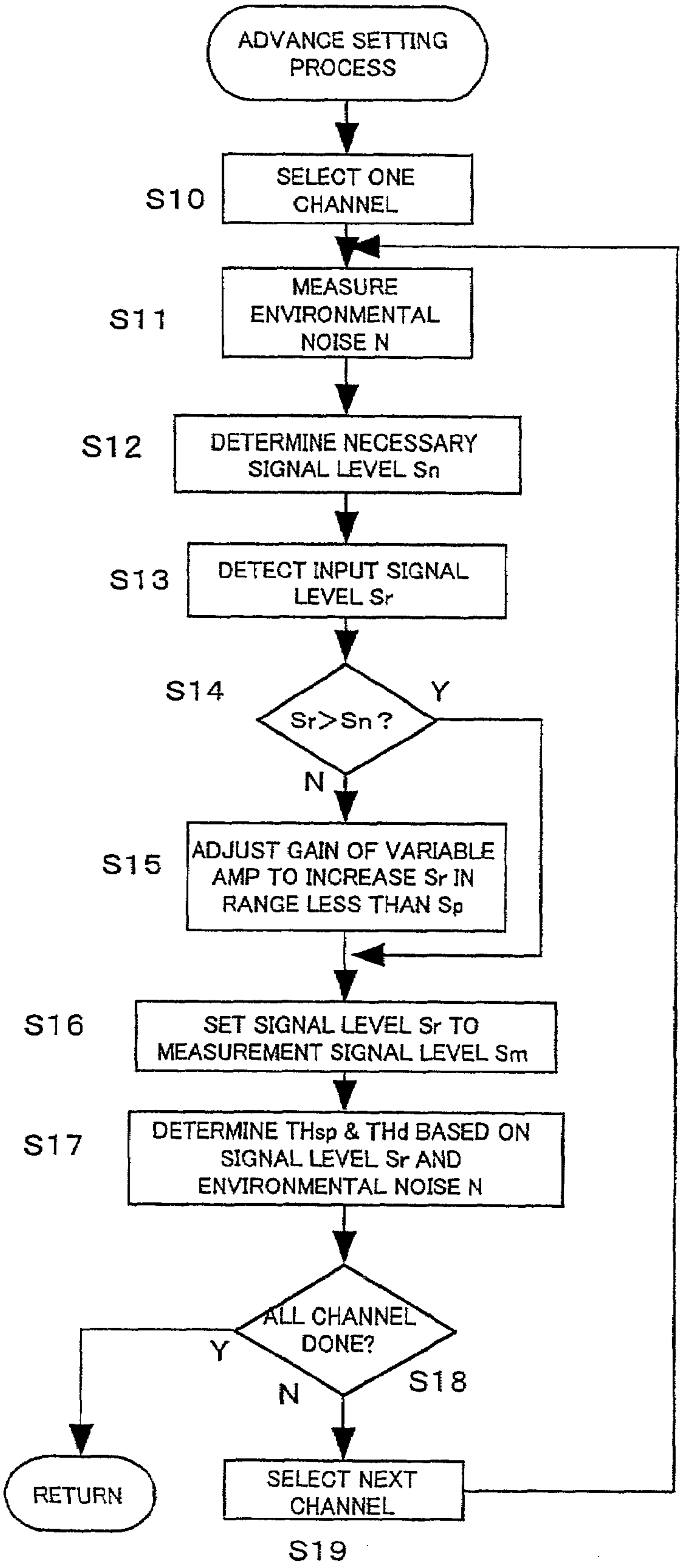
FIG. 8 is a flowchart showing an advance setting process shown in FIG. 7.

First, as a premise for the various correction processes, an advance setting process is executed (step S1). The advance setting process is shown in FIG. 8. The advance setting process includes a process to determine the level of the measurement signal, in consideration of the environmental noise, so as to ensure as ideal S/N ratio as possible in the automatic sound field correction. Further, the advance setting process includes a process to determine the threshold values used in the speaker existence judgment process and the delay characteristics correction process by using the measurement signal level thus determined and the environmental noise.

First, the system controller MPU selects one of the plurality of channels (step S10). The plurality of channels correspond to eight channels shown in FIGS. 1 and 3 of the present embodiment. Now, assuming that the system controller MPU selected the FL-channel, the system controller MPU turns the switches SWN and SW11 ON and turns all other switches OFF thereby to select FL-channel.

Next, the system controller MPU measures the environmental noise N of the selected channel (step S11). Specifically, the microphone 8 collects ambient sound in the acoustic space in the condition that the speaker 6 does not output measurement signal (i.e., no signal condition). Then, the inter-channel level correcting unit 12 shown in FIG. 4 detects the level.

Then, the system controller MPU determines the signal level Sn necessary to obtain ideal S/N ratio to execute the sound field correction. As the ideal S/N ratio (hereinafter referred to as "necessary S/N ratio"), an S/N ratio determined according to various standards or an S/N ratio empirically regarded necessary to execute the automatic sound field correction is preset. The system controller MPU uses the environmental noise N and the necessary S/N ratio to calculate the signal level Sn required to achieve the necessary S/N ratio (step S12).

Next, the measurement signal generator 3 outputs the measurement signal DN, and the microphone 8 collects the sound. The inter-channel level correcting unit 12 detects the input signal level Sr of the signal input via the microphone 8 (step S13). The input signal level Sr thus detected indicates the signal level of the selected channel at that time, and the system controller MPU judges whether or not the signal level Sr satisfies the necessary signal level Sn calculated in step S12 (step S14).

As described above, the necessary signal level Sn is a value with which the S/N radio necessary to perform automatic sound field correction of the audio system can be obtained. Hence, if the judgment in step S14 is positive, the S/N ratio necessary to execute the automatic sound field correction after that has already been satisfied. Therefore, the process goes to step S16.

On the other hand, if the judgment in step S14 is negative, the signal level Sr is not enough to achieve the necessary S/N ratio in relation with the environmental noise N. Therefore, the system controller MPU increases the gain of the variable amplifier ATG1 to increase the signal level Sr to be equal to the necessary signal level Sn (step S15). However, the possible increase of the signal level Sr has a limitation, and the system controller MPU increases the signal level Sr, within the range smaller than the permitted signal level Sp, such that the signal level Sr becomes equal to or as close as possible to the necessary signal level Sn. Here, the permitted signal level Sp is predetermined to a maximum level that the person in the acoustic space in which the audio system is installed does not feel the measurement signal uncomfortable, in consideration of the auditory characteristics of human being.

In order to ensure the S/N ratio in the situation that the environmental noise is high, there is no way other than increasing the signal level. However, if the signal level is increased limitlessly, the level of the measurement signal output by the speaker during the automatic sound field correction becomes too high, and the person in the acoustic space during the automatic sound field correction feels uncomfortable. Therefore, in consideration of the auditory characteristics of human being, the signal level is increased as high as possible to improve the S/N ratio within the range the listener does not feel uncomfortable.

When the signal level Sr is determined in this way, the signal level Sr is set as the measurement signal Sm to be used in the automatic sound field correction after that (step S16). The measurement signal level is a value to achieve the S/N ratio as close as possible to the S/N ratio desired in executing the automatic sound field correction, and also is a value that the person in the acoustic space does feel uncomfortable with large environment noise.

Figure 14:
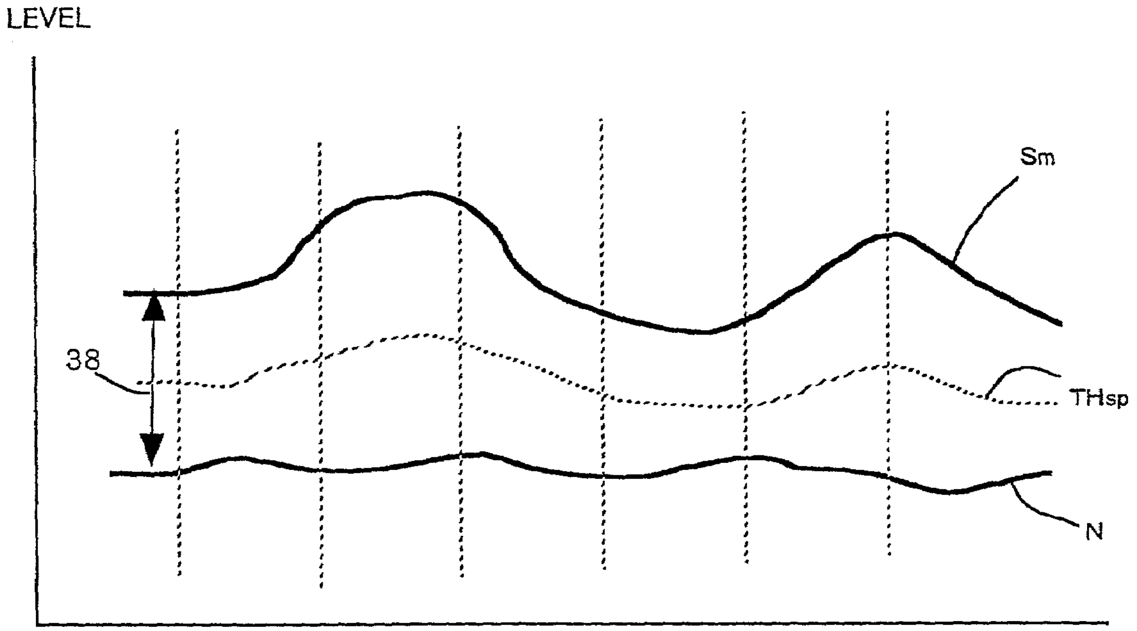
FIG. 14 is an explanatory diagram showing how to determine threshold value in the advance setting process.

Next, based on the measurement signal level Sm and the environmental noise N, the system controller MPU determines the first threshold value THsp used in the speaker existence judgment process and the second threshold value THd used in the delay characteristics correction process (step S17). By referring to FIG. 14, description will be given of the method of determining the first threshold value THsp based on the measurement signal level Sm and the environmental noise N. FIG. 14 schematically shows the method of determining the first threshold value THsp when the measurement signal level Sm and the environmental noise N vary. In FIG. 14, the difference between the measurement signal level Sm and the environmental noise N (i.e., the width 38 in FIG. 14) represents the S/N ratio. The first threshold value THsp is constantly determined at a position between the measurement signal level Sm and the environmental noise N. Normally, the first threshold THsp is determined to the mid-point between the measurement signal level Sm and the environmental noise N as shown in FIG. 14, however, the first threshold value THsp may be determined to other position in consideration of other various factors. Even in that case, the first threshold value THsp is determined to the position between the measurement signal level Sm and the environmental noise N. While FIG. 14 shows the transition of the first threshold value THsp when the measurement signal level Sm and the environmental noise N vary according to the passage of time, for the sake of brevity in explanation, in the present invention, the first threshold value THsp is determined based on the measurement signal level Sm determined at the time of the advance setting (which is equal to the signal level Sr determined in steps S13 and S15) and the environmental noise N measured in step S11.

In addition, the second threshold value THd used in the delay characteristics correction process is determined based on the measurement signal level Sm and the environmental noise N. The second threshold THd is used to detect the pulse signal output as the measurement signal. The positioning of the second threshold value THd between the measurement signal level Sm and the environmental noise N may be determined dependently upon the detection method of the pulse signal. However, in order to accurately perform the pulse detection irrespective of the amount of the environmental noise N, the second threshold THd is also determined to the position between the signal level Sm and the environmental noise N. Since the first and the second threshold values are determined based on the environmental noise previously obtained and the measurement signal level Sm determined in consideration of the necessary S/N ratio, those threshold values are adapted to the acoustic space characteristics, enabling accurate speaker existence judgment and the delay characteristics correction.

When the first threshold value THsp and the second threshold value THd are determined, the system controller MPU judges whether or not the process is completed for all channels (step S18). If there is any channel not processed yet, the next channel is selected (step S19), and the same process is executed. When the process is completed for all channels, the process returns to the main routine shown in FIG. 7.

Figure 9:
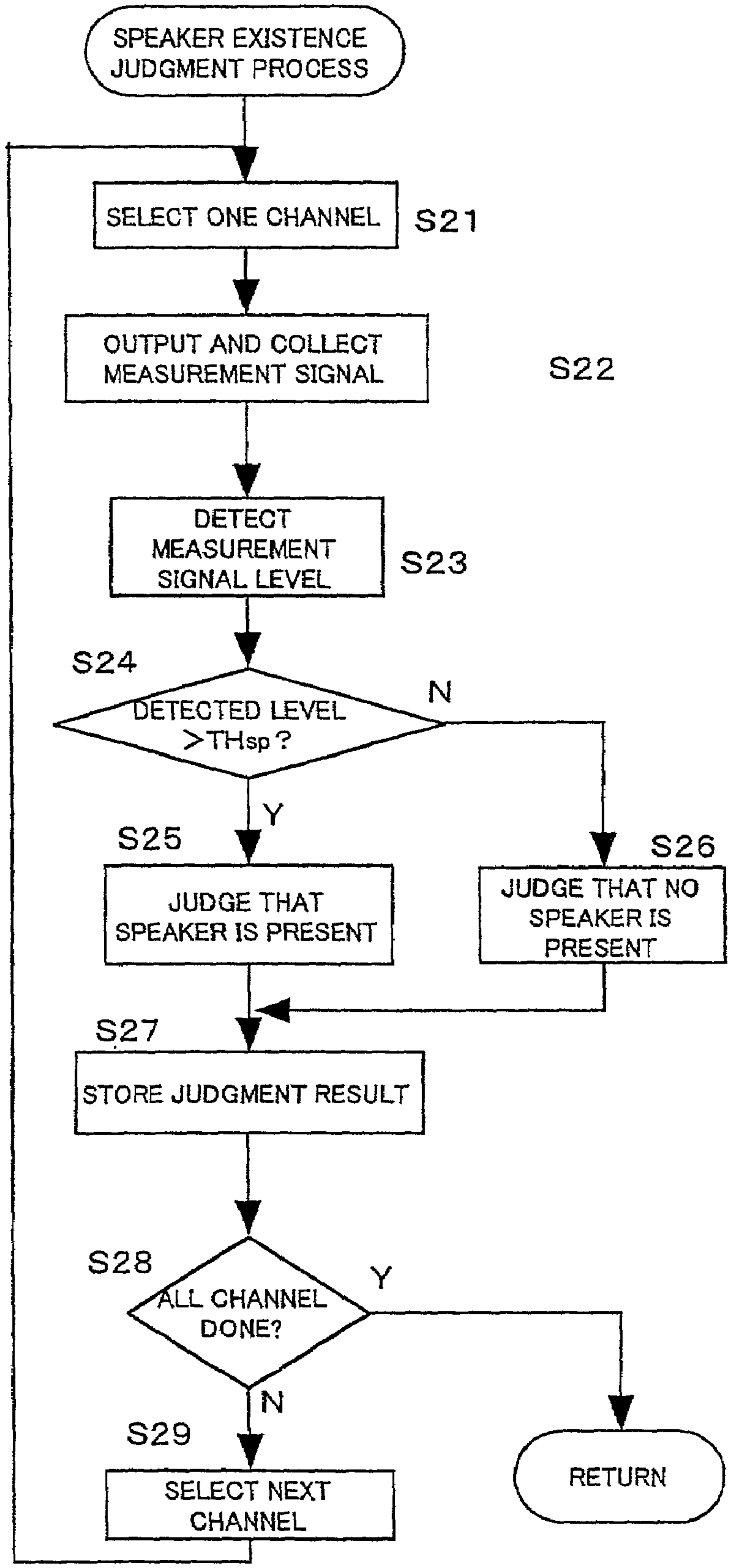
FIG. 9 is a flowchart showing a speaker existence judgment process shown in FIG. 7.

Next, the speaker existence judgment process is executed (step S2). FIG. 9 shows the speaker existence judgment process. First, the system controller MPU selects one channel (step S21), controls the measurement signal generator 3 to output measurement signal from the speaker 6, and collects the sound by the microphone 8 (step S22). The measurement signal used at this time is set to the measurement signal level Sm determined in the advance setting process. Next, the inter-channel level correcting unit 12 shown in FIG. 4 detects the measurement signal level based on the collected sound data DM, and judges whether or not the detected level is larger than the first threshold value THsp previously determined in the advance setting process (see. step S1) (step S24). If the detected level is larger than the first threshold value THsp, it is judged that the speaker is connected to the channel (step S25). If the detected level is smaller than the first threshold value Thsp, it is judged that no speaker is connected to the channel (step S26). Then, the judgment result is stored (step S27), and it is determined whether or not the process is completed for all channels (step S28). If not, the system controller MPU selects next channel (step S29), and repeats the same process to judge whether a speaker is connected to the channel. When the judgment is completed for all the channels of the audio system 100, the speaker existence judgment process ends, and the process returns to the main routine shown in FIG. 7.

Figure 10:
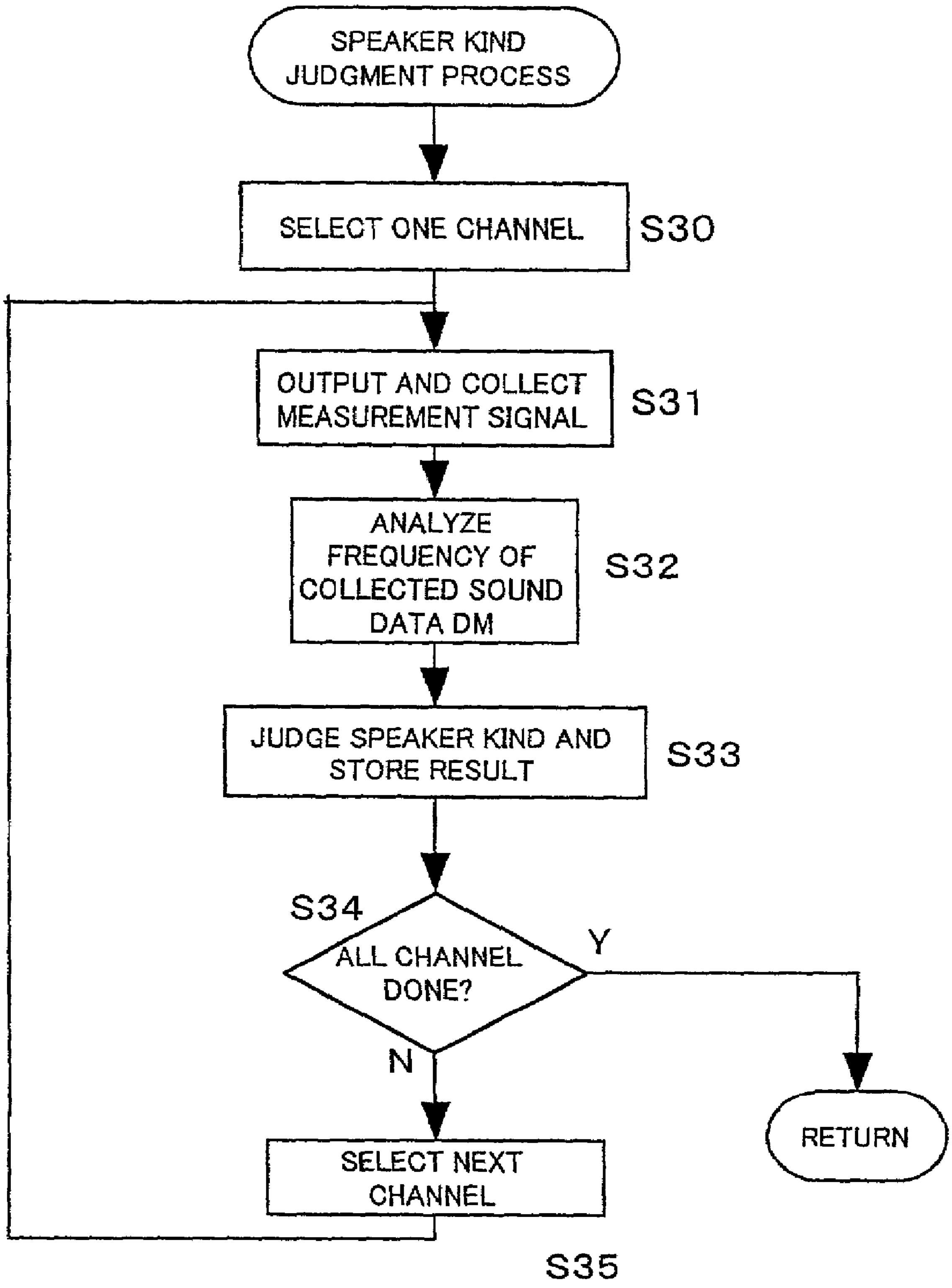
FIG. 10 is a flowchart showing a speaker kind judgment process shown in FIG. 7.

Next, the speaker kind judgment process is executed. FIG. 10 shows the speaker kind judgment process. In FIG. 10, first the system controller MPU selects one channel out of the channels that are judged to be connected to a speaker in step S2 (step S30), outputs the measurement signal DN via the channel, and collect the sound by the microphone 8 (step S31). The measurement signal output at that time is set to the measurement signal level Sm determined by the advance setting process. Next, the system controller MPU controls the frequency characteristics correcting unit 11 shown in FIG. 4 to analyze the frequency characteristics of the collected sound data DM (step S32), judges the kind of the speaker based on the frequency characteristics analysis result and stores the judgment result (step S33). For example, when the low-frequency component and mid-frequency component are detected by the frequency characteristics analysis result, and no or quite small low-frequency component is detected and large mid-frequency component is detected, the speaker is judged to be a small speaker small in size and having relatively low capability of low-range reproduction. If low-range signal and mid-range signal are detected, the speaker is judged to be a large speaker large in size and having reproduction capability of low-range to mid-range sound.

Thus, the system controller MPU executes speaker kind judgment for all channels that are judged to be connected to a speaker in the speaker existence judgment process, and stores the results of the speaker kind judgment. Then, the process returns to the main routine shown in FIG. 7.

Next, the frequency characteristics correction process in step S4 will be described with reference to FIG. 11. First, the system controller MPU selects one channel (step S100). Then, the system controller MPU outputs the measurement signal via the selected channel (step S102). The measurement signal output at that time is set to the measurement signal level Sm determined in the advance setting process. The microphone 8 collects the sound and supplies the collected sound data DM to the signal processing circuit 2 via the amplifier 9 and the A/D converter 10 (step S104). The frequency characteristics correcting unit 11 in the signal processing circuit 2 (see. FIGS. 4 and 5A) operates the equalizer coefficients SF for adjusting the characteristic of the equalizer EQ for the selected channel based on the collected sound data DM, and supplies it to the corresponding equalizer EQ (step S106). Then, the frequency characteristic of the selected channel is corrected (step S108). By this, the frequency characteristic of the channel is set to the desired characteristic. When the frequency characteristic is corrected for one channel in this manner, the system controller MPU checks whether or not frequency characteristics correction process is completed for all channels (step S110). If not, the steps S100 to S108 are repeated. When the frequency characteristics correction process is completed for all channels (step S110; Yes), then the process returns to the main routine shown in FIG. 7.

Figure 11:
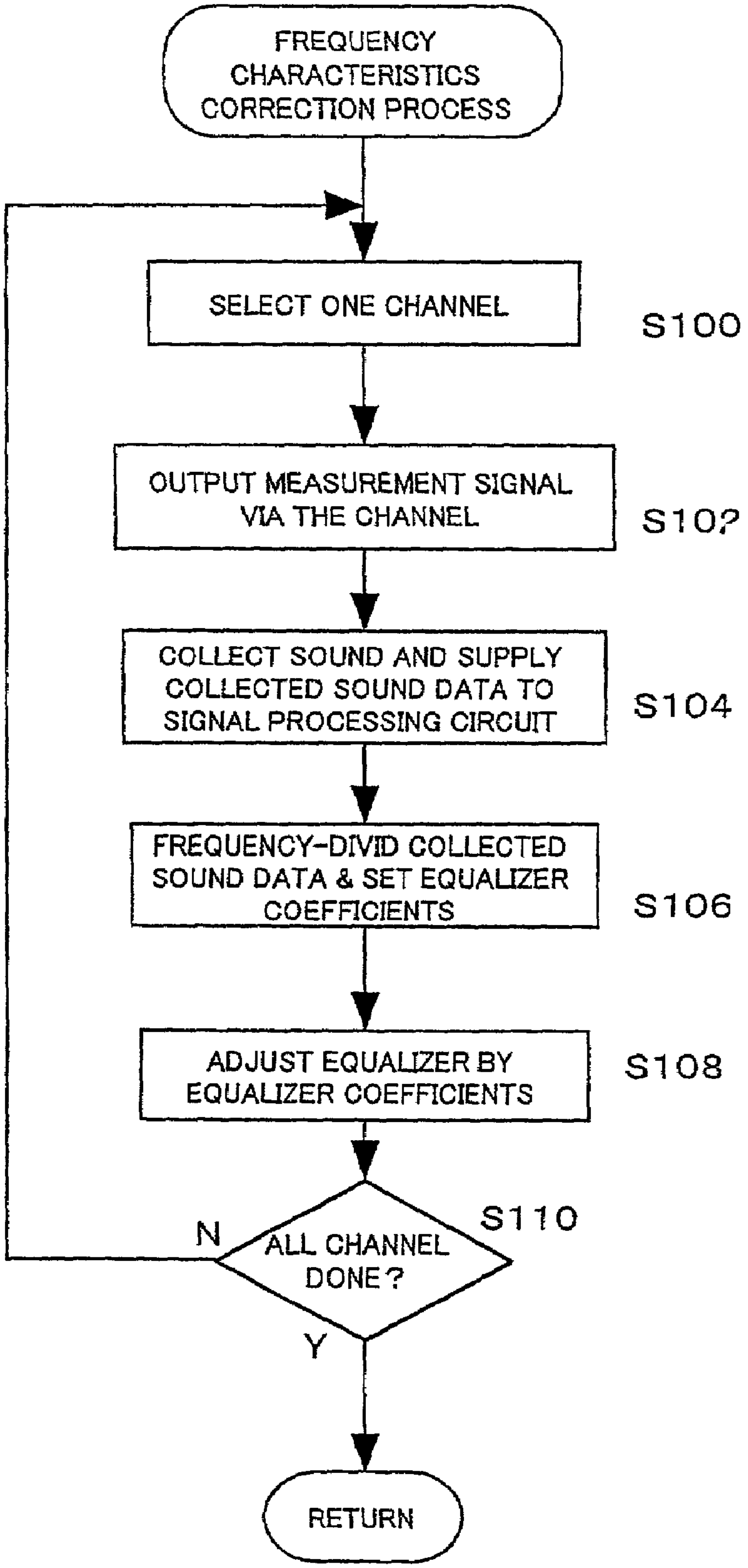
FIG. 11 is a flowchart showing a frequency characteristics correction process shown in FIG. 7.

It is noted that the gain of the equalizer obtained based on the output of the band-pass filter within the coefficient operation unit 11 may include error, and hence steps S102 to S108 shown in FIG. 11 may be repeatedly executed for several times (e.g., four times) to absorb such error.

Figure 12:
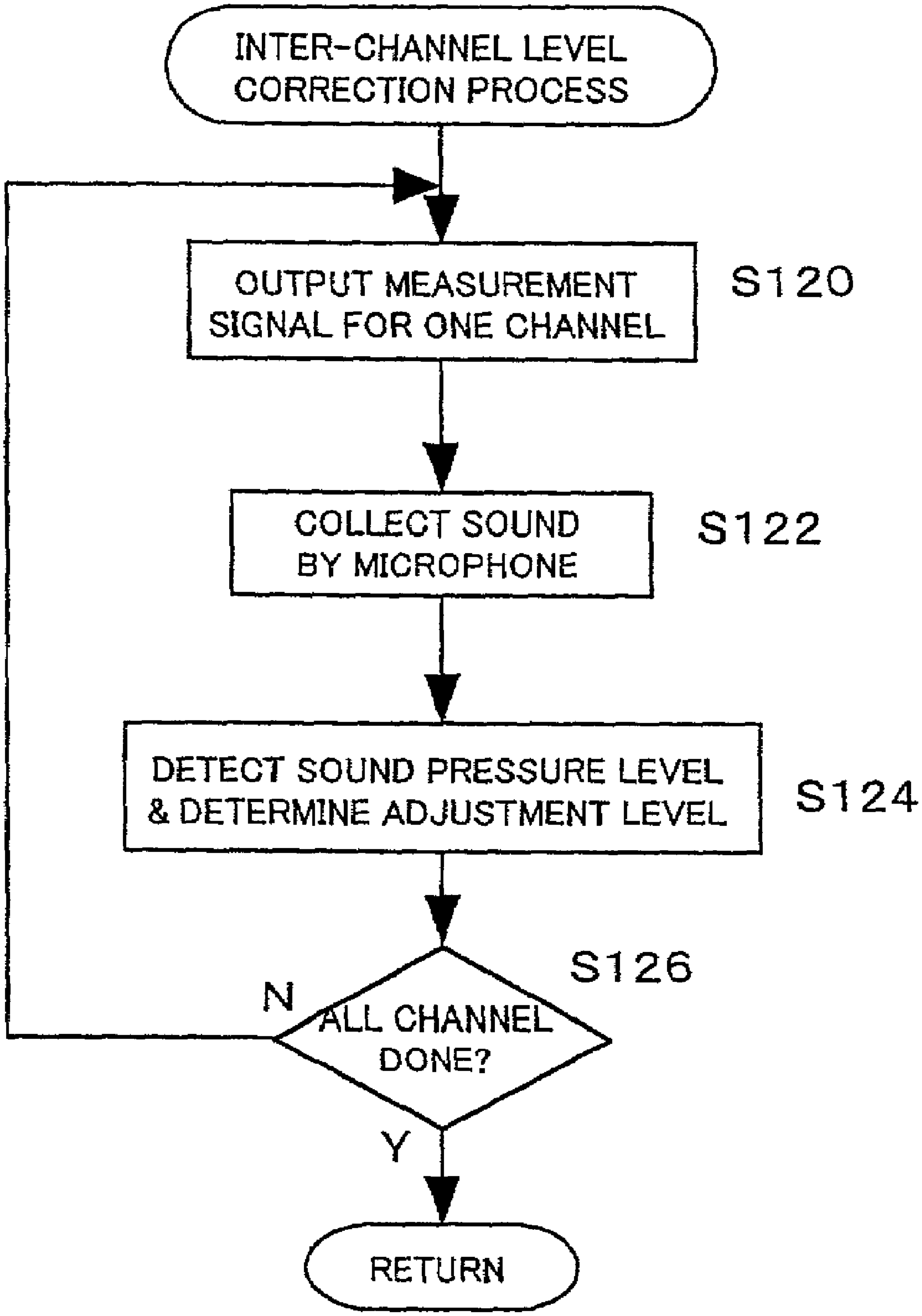
FIG. 12 is a flowchart showing an inter-channel level correction process shown in FIG. 7.

Next, the inter-channel level correction process of step S5 is executed. The inter-channel level correction process is executed according to the flowchart shown in FIG. 12. It is noted that the inter-channel level correction process is executed in such a state that the frequency characteristics of the graphic equalizer GEQ set by the frequency characteristics correction process is maintained.

In the signal processing unit 20 shown in FIG. 3, first the switch SW11 is turned ON and the switch SW1 is turned OFF at the same time. Thus, the measurement signal DN (pink noise) is supplied to one channel (e.g., FL-channel), and the measurement signal DN is output by the speaker 6FL (step S120). The measurement signal output at this time is set to the measurement signal level Sm determined in the advance setting process. The microphone 8 collects the output signal (sound), and the collected sound data DM is supplied to the inter-channel level correcting unit 12 in the coefficient operation unit 30 through the amplifier 9 and the A/D converter 10 (step S122). In the inter-channel level correcting unit 12, the level detecting unit 12*a* detects the sound pressure level of the collected sound data DM, and supplies the detected level to the adjustment amount determining unit 12*b*. The adjustment amount determining unit 12*b* generates the adjustment signal SG1 of the variable amplifier ATG1 so that the detected level becomes equal to the predetermined sound pressure level preset in the target level table 12*c*, and supplies the generated adjustment signal SG1 to the variable amplifier ATG1 (step S124) Thus, the level of one channel is corrected to match the preset level. This process is executed individually for each channel, and when the level correction is completed for all channels (step S126; Yes), the process returns to the main routine shown in FIG. 7.

Figure 13:
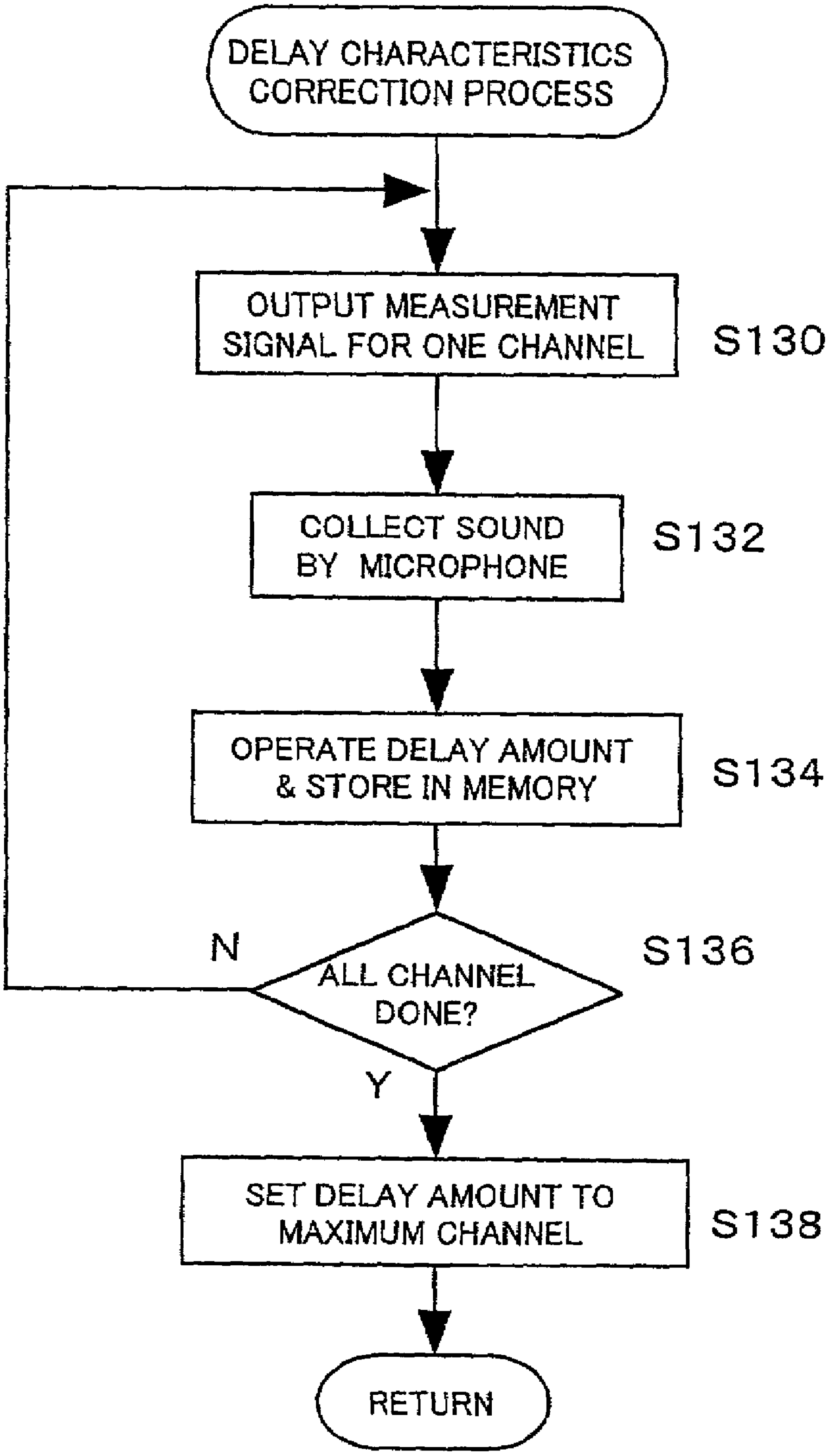
FIG. 13 is a flowchart showing a delay characteristics correction process shown in FIG. 7.

Next, the delay characteristics correction process in step S30 is executed according to the flowchart shown in FIG. 13. First, for one channel (e.g., FL-channel), the switch SW11 is turned ON and the switch SW21 is turned OFF at the same time to output the measurement signal DN from the speaker 6 (step S130). The measurement signal output at this time is set to the measurement signal level Sm determined in the advance setting process.

Then, the microphone 8 collects the output measurement signal DN, and the collected sound data DM is supplied from the microphone 8 to the delay characteristics correcting unit 13 in the coefficient operation unit 30 (step S132). In the delay characteristics correcting unit 13, the delay amount operation unit 13*a* calculates the delay amount for the channel and temporarily stores the delay amount in the memory 13*c* (step S134). This process is executed for all other channels. When the process is completed for all channels (step S136; Yes), the delay amounts for all channels are stored in the memory 13*c*. Then, based on the delay amounts stored in the memory 13*c*, the coefficient operation unit 13*b* determines the coefficients of the delay circuits DLY1 to DLY8 for all channels such that the signals of all channel reach the listening position RV at the same time, and supplies the coefficients thus determined to the delay circuits DLY1 to DLY8, respectively (step S138). Thus, the delay characteristics correction is completed.

In the above manner, the frequency characteristics, the inter-channel levels and the delay characteristics are corrected, and automatic sound field correction is completed.

According to the present invention, the advance setting process is executed prior to the above processes. In the advance setting process, the environmental noise in the acoustic space in which the audio system 100 is installed is detected, and the measurement signal level is set such that the S/N ratio necessary to appropriately carry out the automatic sound field correction can be obtained. In addition, the first threshold value THsp used in the speaker existence judgment process and the second threshold THd used in the delay characteristics correction process are determined based on the actual environmental noise level of the acoustic space and the above-described measurement signal level.

Figure 15:
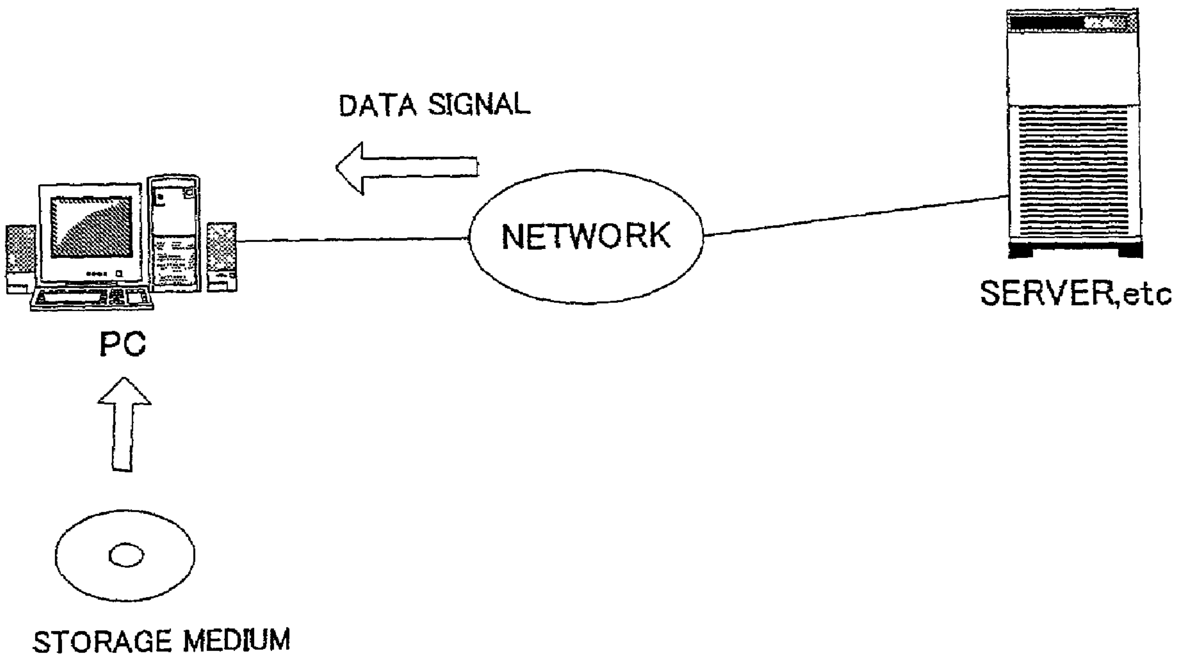
FIG. 15 shows a concept of application of the present invention to computer program.

In the above described embodiments, the signal processing is achieved by the signal processing circuit. Alternatively, the signal processing is designed as a program to be executed on a computer. The concept of this application is shown in FIG. 15. In that case, the program may be supplied in a form of storage medium such as CD-ROM or DVD, or supplied via the communication path through the network. The computer for executing this program may be a personal computer, to which an audio interface for multiple channels, multiple speakers and a microphone are connected as peripheral equipments. In the case of executing the above program in the personal computer, the measurement signal is generated by a sound source provided inside or outside of the computer, the measurement signal is output via the audio interface or speaker and the output sound is collected by the microphone. Thus, the automatic sound field correcting system shown in FIG. 1 may be achieved by a computer.

As described above, according to the automatic sound field correcting system of the present invention, the advance setting process is executed prior to the execution of the plural processes belonging to the automatic sound field correction process. In the advance setting process, the environmental noise level is measured, and the measurement signal level is determined such that the S/N ratio necessary to execute the automatic sound field correction advantageously can be achieved. Further, based on the environmental noise level and the measurement signal level, the first threshold value THsp used for the speaker existence judgment and the second threshold value THd used for the delay characteristics correction are determined. Therefore, the level and the threshold value of the measurement signal used for the automatic sound field correction can be changed in accordance with actual situation such as the environmental noise level of the respective acoustic space and the like. By this, in the acoustic space with large environmental noise, for example, advantageous sound field correction result may be obtained by determining the effective measurement signal level. Further, since limitless increase of the measurement signal level is suppressed in consideration of auditory sense of human being, even if the environmental noise is large, it is possible to avoid excessively large level measurement signal is output and the user of the audio system feels uncomfortable.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No.2001-133572 filed on Apr. 27, 2001 including the specification, claims, drawings and summary is incorporated herein by reference in its entirety.

What is claimed is:

1. An automatic sound field correcting device for applying signal processing onto audio signals of plural channels and outputting processed audio signals to corresponding plural speakers, comprising:

a noise measuring unit for measuring environmental noise level;

a signal level determining unit for determining a measurement signal level based on the environmental noise level; and a correcting unit for outputting a measurement signal having the determined measurement signal level to perform automatic sound field correction, wherein the environmental noise is sound in an acoustic space when the correcting unit does not output the measurement signal, wherein the signal level determining unit comprises:

a calculating unit for calculating a necessary signal level necessary to obtain predetermined necessary S/N level under the measured environmental noise level;

a measuring unit for measuring a microphone input level at a time when a signal output from the speaker is input to a microphone; and a setting unit for setting the microphone input level to the measurement signal level when the microphone input level is larger than the necessary signal level.

2. A device according to claim 1, wherein the noise measurement unit determines the environmental noise level based on an output signal of a microphone when no signal is being output.

3. An automatic sound field correcting device for applying signal processing onto audio signals of plural channels and outputting processed audio signals to corresponding plural speakers, comprising:

a noise measuring unit for measuring environmental noise level;

a signal level determining unit for determining a measurement signal level based on the environmental noise level; and a correcting unit for outputting a measurement signal having the determined measurement signal level to perform automatic sound field correction, wherein the environmental noise is sound in an acoustic space when the correcting unit does not output the measurement signal, wherein the signal level determining unit comprises:

a calculating unit for calculating a necessary signal level necessary to obtain predetermined necessary S/N level under the measured environmental noise level;

a measuring unit for measuring a microphone input level at a time when a signal output from the speaker is input to a microphone; and an increasing unit for increasing the measurement signal level to the necessary signal level, within a range smaller than a predetermined permissible level, when the microphone input level is smaller than the necessary signal level.

4. A device according to claim 3, wherein the noise measurement unit determines the environmental noise level based on an output signal of a microphone when no signal is being output.

5. An automatic sound field correcting device for applying signal processing onto audio signals of plural channels and outputting processed audio signals to corresponding plural speakers, comprising:

a noise measuring unit for measuring environmental noise level;

a signal level determining unit for determining a measurement signal level based on the environmental noise level;

a correcting unit for outputting a measurement signal having the determined measurement signal level to perform automatic sound field correction;

a first threshold value determining unit for determining the first threshold value based on the environmental noise level and the measurement signal level; and a speaker existence judgment unit for judging a connection of a speaker to the channel based on the first threshold, wherein the environmental noise is sound in an acoustic space when the correcting unit does not output the measurement signal.

6. A device according to claim 5, wherein the speaker existence judgment unit comprises:

an output unit for outputting a measurement signal having the measurement signal level;

a determining unit for collecting the measurement signal output and determining a detection level of the collected measurement signal; and a judging unit for determining a presence of a speaker when the detection level is larger than the first threshold value and determining an absence of a speaker when the detection level is smaller than the first threshold value.

7. A device according to claim 6, wherein the first threshold determining unit determines the first threshold value to a middle level of the environmental noise level and the measurement signal level.

8. A device according to claim 7, further comprising:

a second threshold value determining unit for determining a second threshold value based on the environmental noise level and the measurement signal level;

an output unit for outputting a pulse signal; and a measuring unit for measuring a delay characteristic by detecting the pulse signal received by a microphone by using the second threshold value.

9. A program storage medium readable by a computer, tangibly embodying a computer program of instructions executable by the computer to control the computer to function as an automatic sound field correcting device for applying signal processing onto audio signals of plural channels and outputting processed audio signals to corresponding plural speakers, comprising:

a noise measuring unit for measuring environmental noise level;

a signal level determining unit for determining a measurement signal level based on the environmental noise level; and a correcting unit for outputting a measurement signal having the determined measurement signal level to perform automatic sound field correction, wherein the environmental noise is sound in an acoustic space when the correcting unit does not output the measurement signal, and wherein the signal level determining unit comprises:

a calculating unit for calculating a necessary signal level necessary to obtain predetermined necessary S/N level under the measured environmental noise level;

a measuring unit for measuring a microphone input level at a time when a signal output from the speaker is input to a microphone; and a setting unit for setting the microphone input level to the measurement signal level when the microphone input level is larger than the necessary signal level.

10. A program storage medium readable by a computer, tangibly embodying a computer program of instructions executable by the computer to control the computer to function as an automatic sound field correcting device for applying signal processing onto audio signals of plural channels and outputting processed audio signals to corresponding plural speakers, comprising:

a noise measuring unit for measuring environmental noise level;

a signal level determining unit for determining a measurement signal level based on the environmental noise level; and a correcting unit for outputting a measurement signal having the determined measurement signal level to perform automatic sound field correction, wherein the environmental noise is sound in an acoustic space when the correcting unit does not output the measurement signal, and wherein the signal level determining unit comprises:

a calculating unit for calculating a necessary signal level necessary to obtain predetermined necessary S/N level under the measured environmental noise level;

a measuring unit for measuring a microphone input level at a time when a signal output from the speaker is input to a microphone; and an increasing unit for increasing the measurement signal level to the necessary signal level, within a range smaller than a predetermined permissible level, when the microphone input level is smaller than the necessary signal level.

11. A program storage medium readable by a computer, tangibly embodying a computer program of instructions executable by the computer to control the computer to function as an automatic sound field correcting device for applying signal processing onto audio signals of plural channels and outputting processed audio signals to corresponding plural speakers, comprising:

a noise measuring unit for measuring environmental noise level;

a signal level determining unit for determining a measurement signal level based on the environmental noise level;

a correcting unit for outputting a measurement signal having the determined measurement signal level to perform automatic sound field correction;

a first threshold value determining unit for determining the first threshold value based on the environmental noise level and the measurement signal level; and a speaker existence judgment unit for judging a connection of a speaker to the channel based on the first threshold, wherein the environmental noise is sound in an acoustic space when the correcting unit does not output the measurement signal.

* * * * *